(12) United States Patent
Raychaudhuri

(10) Patent No.: US 6,653,882 B2
(45) Date of Patent: Nov. 25, 2003

(54) OUTPUT DRIVERS FOR IC

(75) Inventor: Arindam Raychaudhuri, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/166,981

(22) Filed: Jun. 11, 2002

(65) Prior Publication Data

US 2003/0025535 A1 Feb. 6, 2003

(30) Foreign Application Priority Data

Jul. 31, 2001 (EP) .............................. 01118427

(51) Int. Cl.[7] ................................ H03H 11/26
(52) U.S. Cl. .................. 327/270; 327/276; 327/277; 327/170
(58) Field of Search ................ 327/266, 269, 327/270, 271, 276, 277, 278, 281, 284, 288, 147, 149, 156, 158, 112, 170, 392, 393, 394, 395; 326/30, 26, 27, 86, 87

(56) References Cited

U.S. PATENT DOCUMENTS

| 4,899,071 A | * | 2/1990 | Morales .................. 327/158 |
| 4,922,141 A | * | 5/1990 | Lofgren et al. ............ 327/158 |
| 5,231,319 A | * | 7/1993 | Crafts et al. ............. 327/277 |
| 5,296,756 A | | 3/1994 | Patel et al. .............. 307/443 |
| 5,428,309 A | * | 6/1995 | Yamauchi et al. .......... 327/158 |
| 5,638,019 A | * | 6/1997 | Frankeny ................. 327/295 |
| 5,666,078 A | | 9/1997 | Lamphier et al. .......... 327/108 |
| 5,917,758 A | | 6/1999 | Keeth ..................... 326/27 |
| 6,166,576 A | * | 12/2000 | Stave .................... 327/266 |
| 6,424,175 B1 | * | 7/2002 | Vangal et al. ............. 326/82 |
| 6,486,698 B2 | * | 11/2002 | Yanagawa ................. 326/30 |

FOREIGN PATENT DOCUMENTS

| EP | 0 410 402 A2 | 1/1991 |
| EP | 0 576 204 A1 | 12/1993 |

* cited by examiner

Primary Examiner—Toan Tran
(74) Attorney, Agent, or Firm—Fish & Richardson P.C.

(57) ABSTRACT

The invention features an output driver for integrated circuits that includes a driver that has a data input connected to the integrated circuit, a data output connected to a transmission line leading to the external circuit, and impedance adjusting means for adjusting the output impedance of the driver circuit according to determinable impedance adjusting data. The output driver also includes a dummy circuit having a dummy driver circuit and transmission line, and an impedance control circuit for controlling the output impedance of the driver circuit. The impedance control circuit controls the impedance of the driver circuit by determining the impedance adjusting data (necessary for matching the output impedance of the dummy driver circuit to the characteristic impedance of the dummy transmission line and outputting the determined impedance adjusting data to the impedance adjusting means of the driver circuit.

16 Claims, 7 Drawing Sheets

OUTPUT DRIVERS FOR IC

Pursuant to 35 U.S.C. 119(a)–(d), this application claims priority from European patent application no. 01 118 427.2, filed with the European Patent Office on Jul. 31, 2001.

FIELD OF INVENTION

The invention relates to an output driver for integrated circuits and a method for controlling the output impedance of an integrated circuit.

BACKGROUND OF THE INVENTION

Output drivers are important building blocks in the input/output (I/O) path of integrated circuits like microprocessors and memory systems. They act as the primary interface through which data transmission takes place between the integrated circuit and external systems via transmission lines. For this end, the output driver has to convert the chip-internal logic levels and noise margins to those required for driving the inputs of chip-external circuits in digital systems.

The operation of the output driver of an integrated circuit in certain temperature and supply voltage ranges have to satisfy requirements in both DC and AC conditions, which are specified at the outset of design. The AC operating conditions for the outputs determine the properties of the signal-transients which are to be performed by the output drivers at given DC signal levels, and include the required rise time $t_r$ and fall time $t_f$ of the output signal when the data output is connected to a specific load impedance. Thus, in order to avoid undesired degradations of the output data, the output impedance of the output driver has to be properly matched to the characteristic impedance of the transmission line connecting the data output to the chip-external system.

For lossless transmission lines which are terminated by purely ohmic impedances ($Z_L=R$), the voltage reflection coefficient $\rho_v$ is given by $\rho_v=(R-Z_0)/(R+Z_0)$ wherein $Z_0$ is the characteristic wave impedance of the transmission line. Therefore, if the characteristic impedance of the transmission line $Z_0$ matches the output impedance of the output driver, no signal reflection occurs and $\rho_v=0$.

The characteristic impedance of the transmission may have a slight temperature dependency. Furthermore, the channel resistances of the n- and p-MOS transistors of the output driver will vary with the (manufacturing) process (P), the operating voltage (V) and the operating temperature (T). In order to minimize or avoid impedance mismatches caused by such PVT-variations, so called PVT-sensors have been applied in conventional output drivers. These sensors detected PVT changes and, using predetermined impedance correction data, correspondingly adjust the output impedance of the output driver. However, applying PVT-sensors in integrated circuits has severe drawbacks in that they are complicated circuits with limited impedance correction accuracy.

SUMMARY OF THE INVENTION

An object of the present invention is to provide an output driver for integrated circuits (such as memory or microprocessor circuits), which allows for a simple and efficient control of the output impedance thereof. It is further an object of the invention to provide a method for controlling the output impedance of an integrated circuit.

These problems are solved by an output driver according to claim 1 and a method according to claim 10, respectively. Preferred embodiments are subject of the dependent claims.

According to the invention an output driver for integrated circuit includes:
- at least one driver circuit for driving an external circuit, the driver circuit having
- at least one data input connectable to the integrated circuit;
- at least one data output connectable to a transmission line leading to the external circuit; and
- impedance adjusting means for adjusting the output impedance of the driver circuit according to determinable impedance adjusting data;
- at least one dummy circuit comprising a dummy driver circuit and a dummy transmission line, the dummy driver circuit and the dummy transmission line being electrical replica of the driver circuit and of the transmission line, respectively; and
- at least one impedance control circuit for controlling the output impedance of the driver circuit, the impedance control circuit being connected to the dummy circuit and the impedance adjusting means;
- wherein the impedance control circuit is adapted to control the impedance of the driver circuit by determining the impedance adjusting data necessary for matching the output impedance of the dummy driver circuit to the characteristic impedance of the dummy transmission line and outputting the determined impedance adjusting data to the impedance adjusting means of the driver circuit.

Hence, according to one aspect of the invention, the output driver includes an additional "dummy" circuit, which is essentially used to determine the impedance adjusting data necessary for matching the output impedance of the driver circuit to the characteristic impedance of the transmission line. This dummy circuit includes a replica of the (actual) driver circuit as well as a replica of the (actual) transmission line. Thus, the actual driver circuit and the actual transmission line are electrically or physically modeled as dummy replica circuits in the output driver. It is to be understood that the dummy circuit does not have a data output connectable to the external circuit, i.e. the dummy transmission line is not connected to the external circuit.

Similarly, the dummy driver circuit also includes electrical replica of the impedance adjusting means. The impedance control circuit uses this dummy circuit to determine which impedance adjusting data, under the present operating voltage and temperature, are necessary for matching the impedances. Since the dummy driver circuit and the dummy transmission line are designed to have the same electrical characteristics as the actual driver circuit and the actual transmission line, the impedance adjusting data thus determined are suitable for an efficient matching of the driver circuit to the transmission line connected thereto. Consequently, a complicated PVT-sensor is not necessary. Instead, changes of the channel resistances of the driver transistors of the driver circuit resulting in changes of the output impedance are detected by the impedance control circuit using the dummy circuit.

Preferably, the dummy driver circuit is a scaled down replica of the driver circuit. The scaling factor might, for example, lie within the range of two to ten. Scaling down the transistor dimensions of the dummy driver circuit relative to those of the driver circuit is favorable, since smaller transistors in the dummy circuit will dissipate less power. Therefore, less heat is generated by the dummy circuit so that such an output driver is also applicable in low-energy applications.

The dummy driver circuit does not need to be an exact replica of the driver circuit in a geometrical sense. Although the dummy driver circuit might be designed to represent an exact geometrical miniature replica of the driver circuit (for example scaled down by the geometrical factor of eight), it is equally possible to use a different (favorably simpler) design for the dummy driver circuit as long as its electrical characteristics closely resemble those of the (actual) driver circuit. Increases of the channel resistances of scaled down transistors in the dummy driver circuit have to be accounted for when determining the impedance adjusting data used for matching the output impedance of the driver circuit. Beneficially, if the transistors in the dummy driver circuit are scaled down by a geometrical scaling factor of k (resulting in an increase of the channel resistances by this factor of k), the dummy transmission line is designed to have a characteristic impedance of $k*Z_0$, wherein $Z_0$ is the characteristic impedance of the actual transmission line. Thus, the impedance of the dummy transmission line is scaled up by k, if the transistors of the dummy driver circuit are scaled down by k.

Favorably, the dummy transmission line includes at least one polysilicon resistor and/or metal resistor. As described above, impedance mismatches between the driver circuit and the transmission line connected thereto can arise due to variations of the electrical characteristics of the transistors of the driver circuit as well as due to variations of the characteristic impedance of the transmission line. Therefore, in order achieve a precise impedance matching, it is favorable to model the electric characteristics of the transmission line within the dummy circuit as closely as possible. The dummy transmission line included within the dummy circuit is designed to be an electrical replica of the (actual) transmission line, which is specified to be used with the integrated circuit. For this end, the dummy transmission line may include polysilicon resistors (gate contact resistors (GC-resistors)) and/or metal resistors. Furthermore, also diffusion resistors and other electrical components may be applied. Favorably, the temperature dependency of the characteristic impedance of the transmission line is also modeled, so that the effects of temperature variations on the characteristic impedance of the transmission line can be accounted for.

According to a preferred embodiment, the impedance adjusting means includes a plurality of impedance adjusting transistors connected in parallel, the gate potentials of the transistors being determined by the impedance adjusting data. Depending on the impedance adjusting data, none, some or all of the impedance adjusting transistors are activated. This parallel circuitry of transistors is used at the output stage of the driver circuit, so that it influences the output impedance thereof. For example, the circuit of parallel impedance adjusting transistors could be connected in parallel or in series to an output driver transistor of the driver circuit.

According to a preferred embodiment, the driver circuit is a push-pull on-chip current driver (PP-OCD). Although the invention is equally applicable to so called open drain on-chip current drivers (OD-OCD), it is particularly favorable for the use within PP-OCD. PP-OCD are a widely used on-chip driver type in memory (especially DRAMs) and other VLSI systems. Such an output driver typically has a tristate output waveform at the date output. When no data is to be transmitted, the data output of a PP-OCD remains at a reference voltage (VREF), which is typically half of the external supply voltage VDD. When a (binary) logic "1" is to be transmitted, a push-up circuit of the PP-OCD will be active and the output will be pushed-up from the VREF value by a predetermined amount. Similarly, when a (binary) logic "0" is to be transmitted, the output will be pulled-down by the same preset amount.

In order to ensure a proper communication between the PP-OCD and the external world through the transmission line, it is necessary that the output impedance of the both the push-up circuit and the pull-down circuit of the PP-OCD should equal the characteristic impedance $Z_0$ of the transmission line so that the output of the PP-OCD remains at the VREF potential when not data is transmitted. Thus, the PP-OCD has to be operated symmetrically (the so called symmetry of operation for PP-OCD). According to the present invention, the symmetry of operation can be easily achieved and an effective matching of impedances between the output driver and the transmission line is possible.

Favorably, the impedance adjusting means includes:
 a first group of p-transistors connected in parallel between a high supply voltage and a push-up circuit of the driver circuit, and
 a second group of n-transistors connected in parallel between a low supply voltage and a pull-down circuit of the driver circuit.

Thus, in order to adjust the output impedance of the driver circuit, a plurality of p-transistors can be connected in parallel between a high supply voltage (VDD) and the push-up circuit of the output driver. Therefore, the first group of p-transistors is connected in series between the supply voltage and the push-up circuit. Consequently, depending on the activated number of p-transistors of the first group, the (total) output impedance of the driver circuit for the binary data "1" can be adjusted. The same applies for the pull-down circuit used for outputting a logic "0".

Favorably, the first and/or the second group include N of the transistors and the impedance adjusting data are N-bit binary data. The transistors of the first and/or second group do not necessarily have identical design parameters. In a simple embodiment, for example, N different transistors are used. The transistor representing the first bit of the N-bit binary data might have a channel resistance R. The (second) transistor representing the second bit of the N-bit binary data might have a channel resistance of $R/2^1$. The (third) transistor representing the third bit of the N-bit binary data might have a channel resistance of $R/2^2=R/4$ and so on. Therefore, by applying the N-bit binary data to such a group of parallel transistors, $2^N$ different resistance values can be set. In practice, sufficient results are achieved using four transistors, i.e. 4-bit binary data.

According to a preferred embodiment, the impedance control circuit is adapted to determine and to output the impedance adjusting values at regular intervals. Although it is possible to determine and to output the impedance adjusting data for each clock cycle of the integrated circuit, it is usually sufficient to determine and to output the impedance adjusting data at larger intervals.

Favorably, in case a DRAM-circuit is used as the integrated circuit, the impedance control circuit determines and outputs impedance adjusting data within every refresh cycle. Favorably, the impedance control circuit has an adjusting mode and a preset mode, which are externally selectable. In the adjusting mode of the impedance control circuit, the impedance adjusting data are determined using the dummy circuit. In the preset mode, predetermined impedance adjusting data are outputted to the driver circuit. These predetermined impedance adjusting data represent typical correction values resulting in an acceptable impedance matching under typical operating conditions. Furthermore, the impedance control circuit might also have a test mode, which will help to check the functionality of the impedance control circuit as well as to allow a manual control of the impedance adjusting data from the external world.

According to another preferred embodiment, the impedance control circuit includes an adjusting data generator outputting binary impedance adjusting data to the dummy driver circuit and a comparator comparing the impedance of the dummy driver circuit to the characteristic impedance of the dummy transmission line. In a simplest embodiment, such an adjusting data generator might be a counter. In an adjusting mode of the impedance control circuit, the counter will increment and output binary impedance adjusting data to the dummy circuit. For every impedance adjusting data outputted by the counter, the comparator will compare the voltage drop on the dummy transmission line with a fixed reference voltage. For the impedance adjusting data for which the detected voltage on the dummy transmission line closely equals the reference voltage, the impedance matching is achieved. These impedance adjusting data are subsequently outputted to the driver circuit in order to match the output impedance thereof to the characteristic impedance of the transmission line.

According to the invention, a method for controlling the output impedance of an integrated circuit includes the steps of proving the integrated circuit comprising at least one driver circuit for driving an external circuit, the driver circuit having
at least one data input connectable to the integrated circuit;
at least one data output connectable to a transmission line leading to the external circuit; and
impedance adjusting means for adjusting the output impedance of the driver circuit according to determinable impedance adjusting data;

determining the impedance adjusting data necessary for matching the output impedance of a dummy driver circuit to the characteristic impedance of a dummy transmission line, the dummy driver circuit and the dummy transmission line being electrical replica of the driver circuit and of the transmission line, respectively; and outputting the determined impedance adjusting data to the impedance adjusting means of the driver circuit to match the output impedance of the driver circuit to characteristic impedance of the transmission line.

Therefore, unlike conventional methods for controlling the output impedance of integrated circuits, determining the impedance adjusting data involves determining impedance adjusting data suitable for impedance matching of a dummy driver circuit to a dummy transmission line. These dummy circuits are electrical replica of the actual driver circuit and actual transmission line. A complicated sensing of PVT-changes using sensors is not necessary.

BRIEF DESCRIPTION OF THE DRAWINGS

In the following, the invention is described in detail with reference to preferred embodiments along with accompanying drawings:

FIGS. 5a, 5b-1 and 5b-2 are schematic circuit diagrams of a preferred embodiment of an output driver showing an impedance control circuit thereof.

DETAILED DESCRIPTION

Figure 1:
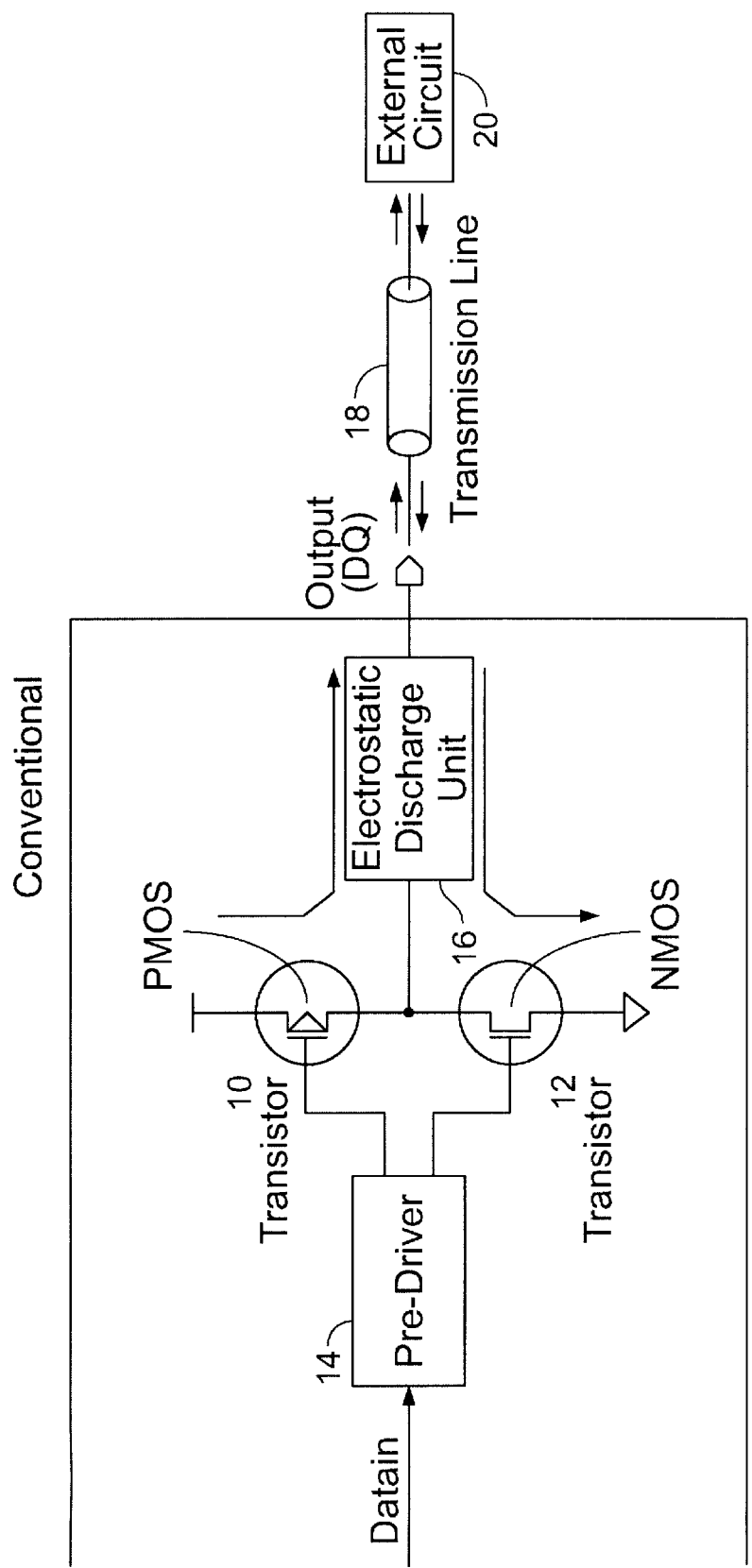
FIG. 1 is a simplified and schematic circuit diagram of a conventional output driver connected via a transmission line to an external circuit.

FIG. 1 shows a strongly simplified schematic circuit diagram of a conventional output driver for integrated circuits. With reference to this conventional output driver, the essential elements and design issues necessary for understanding the invention will be described.

The output driver in FIG. 1 is a highly simplified type of a push-pull OCD (PP-OCD). This particular type of output driver is frequently used in memory (especially DRAMs) and other VLSI systems. It includes a push-up circuit and a pull-down circuit, which are for simplicity represented by the transistors 10 and 12, respectively. The transistors 10 and 12 are connected in an inverter-like configuration, wherein the inverter inputs (the gates of the transistors 10 and 12) are connected to a data pre-driver 14 and the inverter output being connected to an electrostatic discharge unit (ESD) 16. The input of the data pre-driver 14 is connected to the integrated circuit and the data output (DQ) of the electrostatic discharge unit 16 is connected via a transmission line 18 to an external circuit 20. It should be understood that this external circuit could also be an integrated circuit on the same chip as the output driver.

Figure 2:
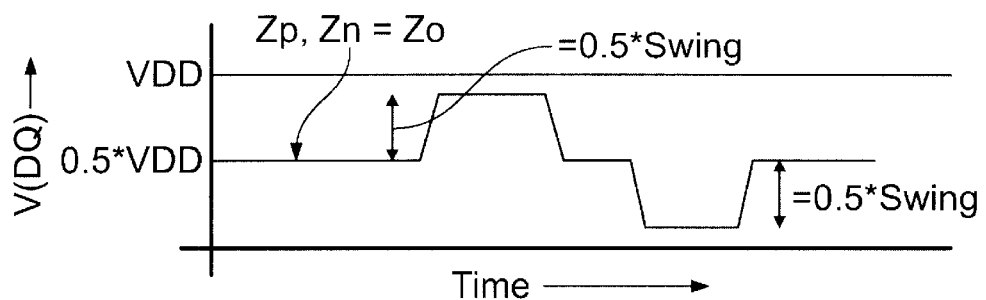
FIG. 2 is a typical output waveform from a push-pull on-chip driver.

The typical waveform at the output (DQ) of such a PP-OCD is shown in FIG. 2. When no data is to be transmitted, the output (DQ) of the output driver remains at a reference voltage VREF, which is typically half of the external supply voltage VDD. When a logic "1" is to be transmitted, the p-MOS transistor 10 (the push-up circuit) will be active and the output will be pushed-up from the VREF value by an amount "swing*0.5". Similarly, when a logic "0" is to be transmitted, the output (DQ) will be pulled-down by an amount "0.5*swing".

As explained above, since the output driver is communicating with the external world through the transmission line 18, it is necessary that the resistance of the p-transistor 10 and the n-transistor 12 of the output driver equal the characteristic impedance $Z_0$ of the transmission line 18 so that the output (DQ) of the output driver remains at VREF potential when no data is transmitted. This is known as the symmetry of operation for PP-OCD.

Now, the characteristic impedance of the transmission line 18 may change with temperature (T). Further, the resistance of the p-MOS transistor 10 (the push-up circuit) and of the n-MOS transistor 12 (the pull-down circuit) may change with process (P), voltage (V) and temperature (T). As a result, the resistances of the transistors 10, 12 will not match the characteristic impedance $Z_0$ of the transmission line 18. Hence, depending on the PVT-conditions, the resistances of the transistors 10, 12 have to be adapted to the characteristic impedance $Z_0$ of the transmission line 18 in order to ensure symmetry of operation. Otherwise, data will be degraded when it reaches the receiving end 20.

According to the invention, the output impedance of the output driver is controlled using an impedance control circuit 22 cooperating with a dummy circuit 24. In the following, an embodiment of the invention will be described with reference to FIGS. 3 and 4.

Figure 3A:
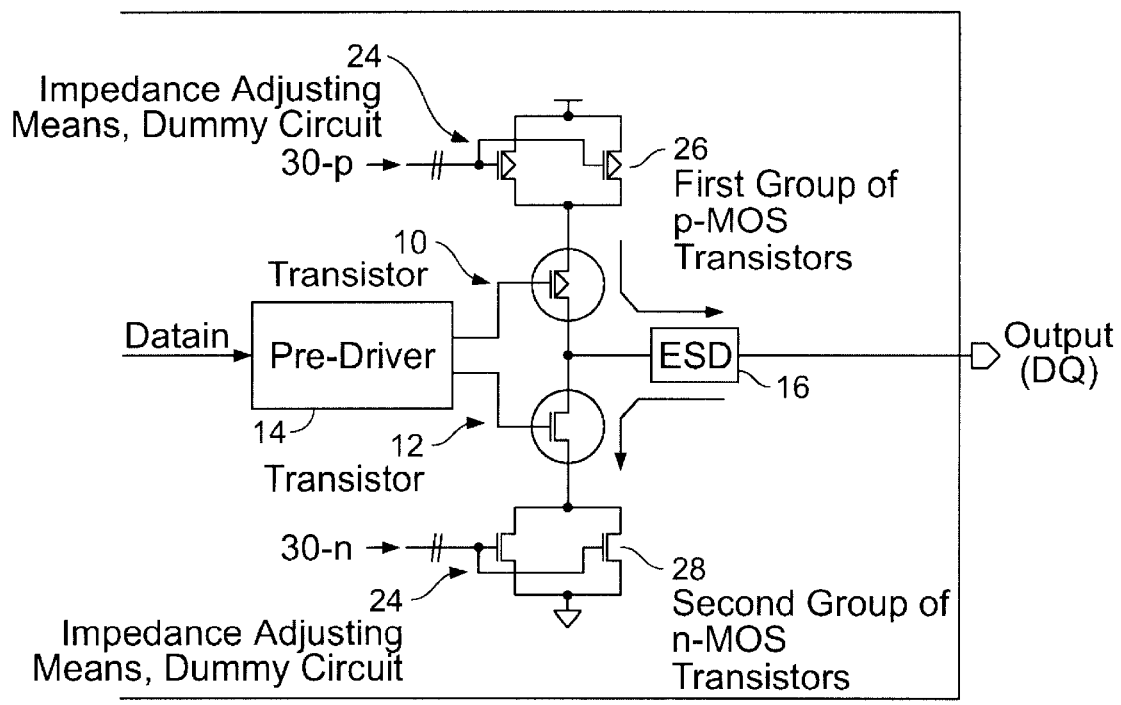
FIG. 3a is a schematic and simplified circuit diagram of a driver circuit according to an embodiment of the invention.

Referring to FIG. 3, embodiments of an output driver of the push-up/pull-down type is depicted. Specifically, FIG. 3a shows a highly simplified type of a PP-OCD. In addition to the schematic output driver shown in FIG. 1, the output driver according to FIG. 3a includes impedance adjusting means 24. For the pull-up circuit 10, which includes at least one p-MOS (driving) transistor, the impedance adjusting means 24 include a first group of p-MOS transistors 26. The transistors 26 are connected in parallel between a high supply voltage VDD and the drain contact of the p-transistor of the pull-up circuit 10. In FIG. 3a the first group of transistors 26 only includes two transistors. However, it should be understood that in order to improve the adjustability of the output impedance of the push-up circuit 10 more than two p-transistors can be used in the first group 26.

Similarly, a second group of n-MOS transistors 28 is connected in parallel between the source contact of an n-MOS transistor of the pull-up circuit 12 and a low supply voltage (ground). The gate contacts of the p-transistors of the first group 26 are connected with a N-bit data line, if N p-transistors are included in the first group 26. Thus, the gates of the p-transistors of the first group 26 can be addressed individually by the impedance adjusting data 30-p. Similarly, the gate potentials of the second group 28 can be individually controlled by the impedance adjusting data 30-n. The other parts of the driver circuit shown in FIG. 3a resemble corresponding parts previously described with reference to FIG. 1.

Figure 3B:
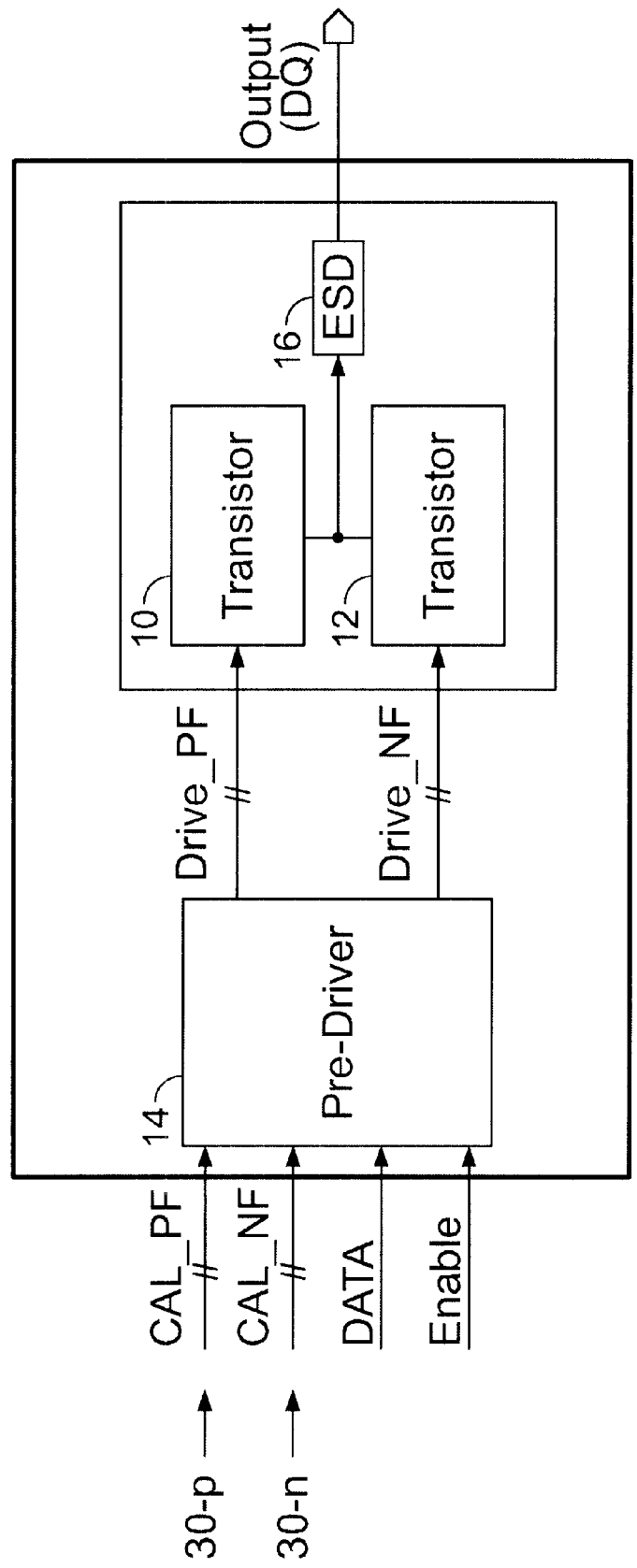
FIG. 3b is a schematic and simplified circuit diagram of a driver circuit according to a preferred embodiment of the invention.

In FIG. 3b, an advanced type of a preferred driver circuit according to the invention is depicted. In this embodiment, the driver circuit includes a data pre-driver 14, a push-up circuit 10, a pull-down circuit 12 and an ESD 16. The data pre-driver 14 drives the push-up and pull-down circuits 10 and 12. The data pre-driver 14 includes the data input DATA (corresponds to DATAIN in FIG. 3a) and inputs for the impedance adjusting data 30-p and 30-n. Furthermore, an enable input is provided.

Figure 4:
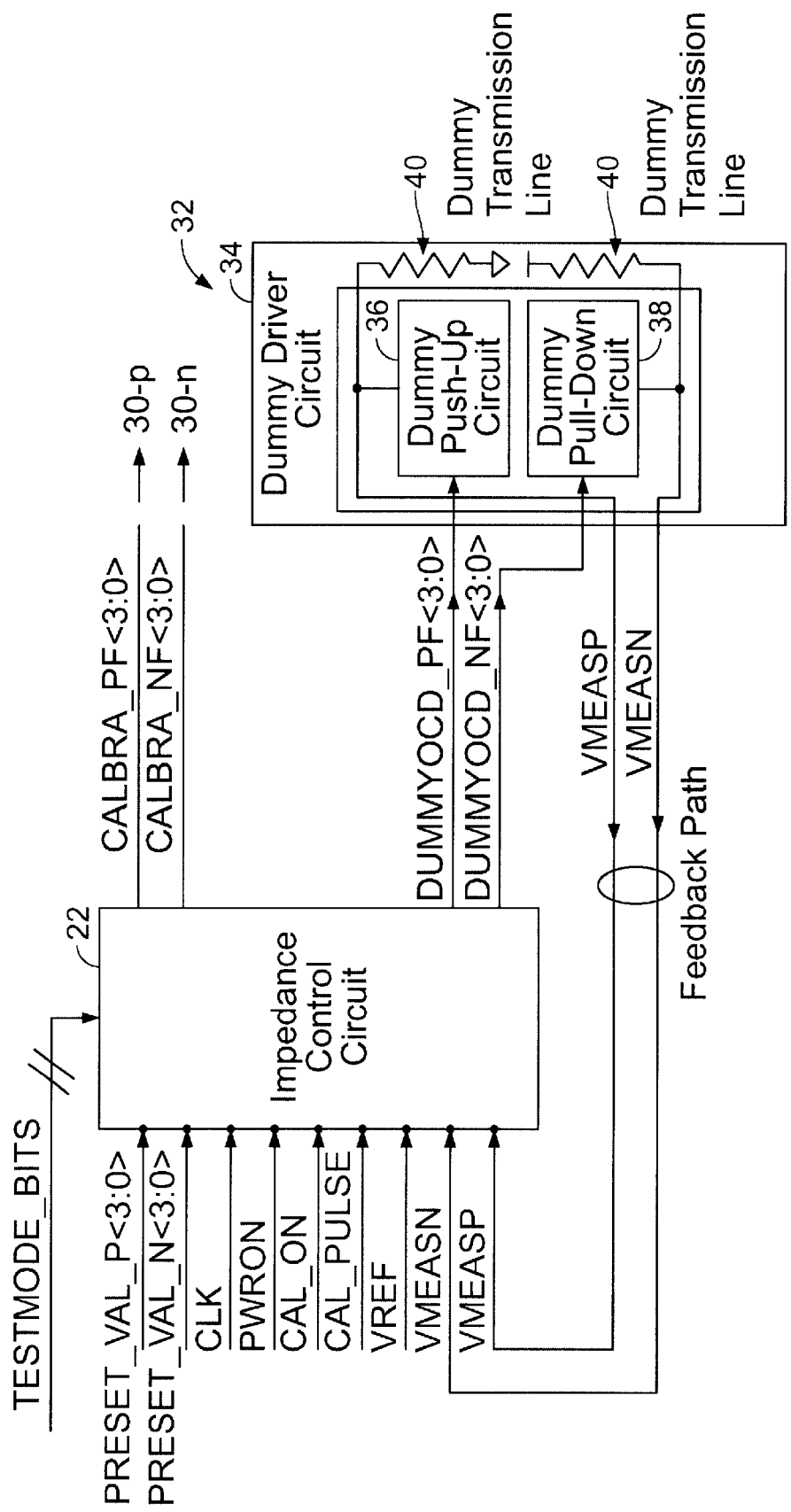
FIG. 4 is a schematic and simplified circuit diagram of a dummy circuit and an impedance control circuit of the embodiment of the output driver shown in FIG. 3.

In FIG. 4, the impedance control circuit 22 and the dummy circuit 32 used in conjunction with the driver circuit shown in FIG. 3a or 3b are depicted. The dummy circuit 32 includes a scaled-down replica of the driver circuit shown in FIG. 3a or 3b. This dummy driver circuit 34 includes a dummy push-up circuit 36 and a dummy pull-down circuit 38 being replica of the circuits 10 and 12, respectively. The transistors included in the dummy driver circuit 34 are, for example, scaled-down by a scaling factor 8 relative to the transistors of the (actual) driver circuit shown in FIG. 3. Similar to the driver circuit depicted in FIG. 3, the dummy driver circuit 34 is also connected to a "transmission line". However, this transmission line is a dummy transmission line 40 representing an electrical replica of the (actual) transmission line 18. The impedance of the dummy transmission line is scaled up by the same factor of 8 to account for the scaling down of the transistor dimensions. Contrary to the (actual) transmission line 18, the dummy transmission lines 40 are not connected to an external circuit. Instead, the dummy transmission lines 40 are connected to the low supply voltage (ground) in case of the dummy pull-up circuit 36 and to the high supply voltage (VDD) in case of the dummy push-down circuit 38. Therefore, the complete electrical environment of the driver circuit is modeled by the dummy circuit 32.

In order to determine the impedance adjusting data 30-n, 30-p necessary for matching the output impedance of the driver circuit to the characteristic impedance $Z_0$ of the transmission line 18, the impedance control circuit 22 outputs (dummy) impedance adjusting data (DUMMYOCD_PF<3:0>; DUMMYOCD_NF<3:0>) to the dummy circuit 32. Subsequently, the impedance control circuit 22 compares the voltage drops on the dummy transmission lines 40 (VMEASP; VMEASN) with a predetermined reference voltage in a voltage comparator of the impedance control circuit 22. If this voltage is, for example, equal to VDD/2, then the output impedance of the dummy circuit 33 equals the characteristic impedance of the dummy transmission line. These impedance adjusting data 30-n; 30-p are subsequently outputted to the driver circuit as shown in FIG. 3.

Figure 5A:
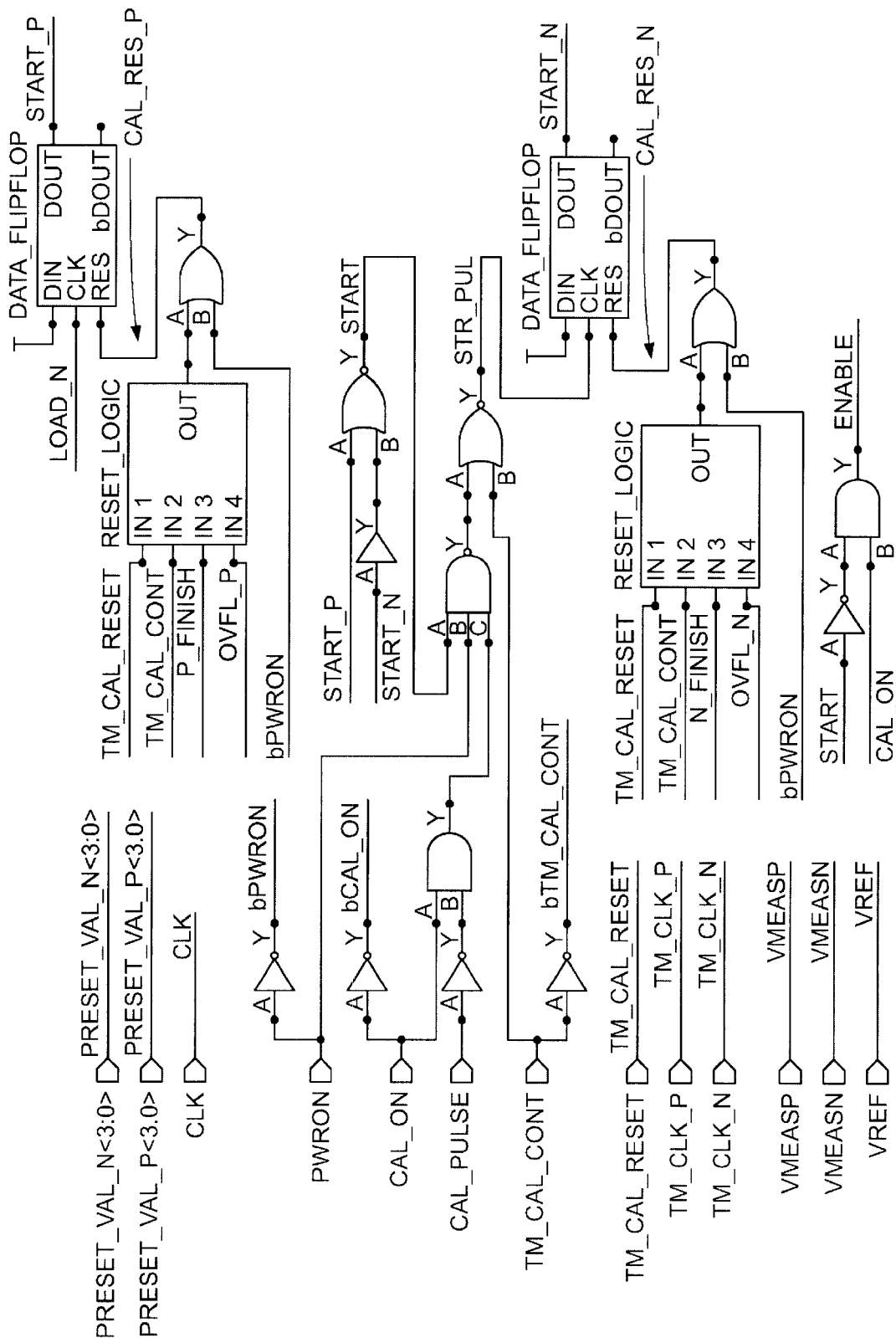
Figures 1, 5B:
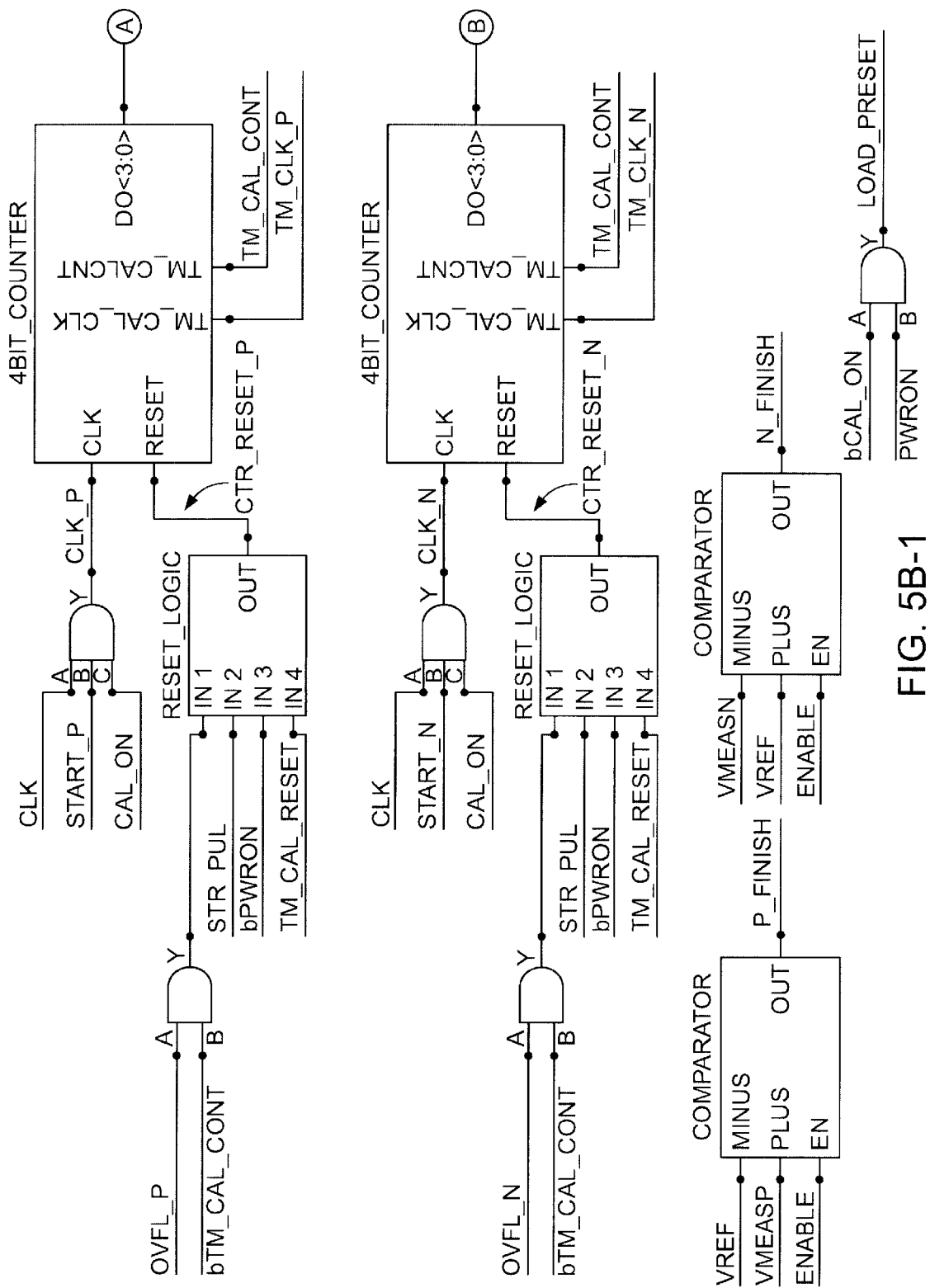
Figures 2, 5B:
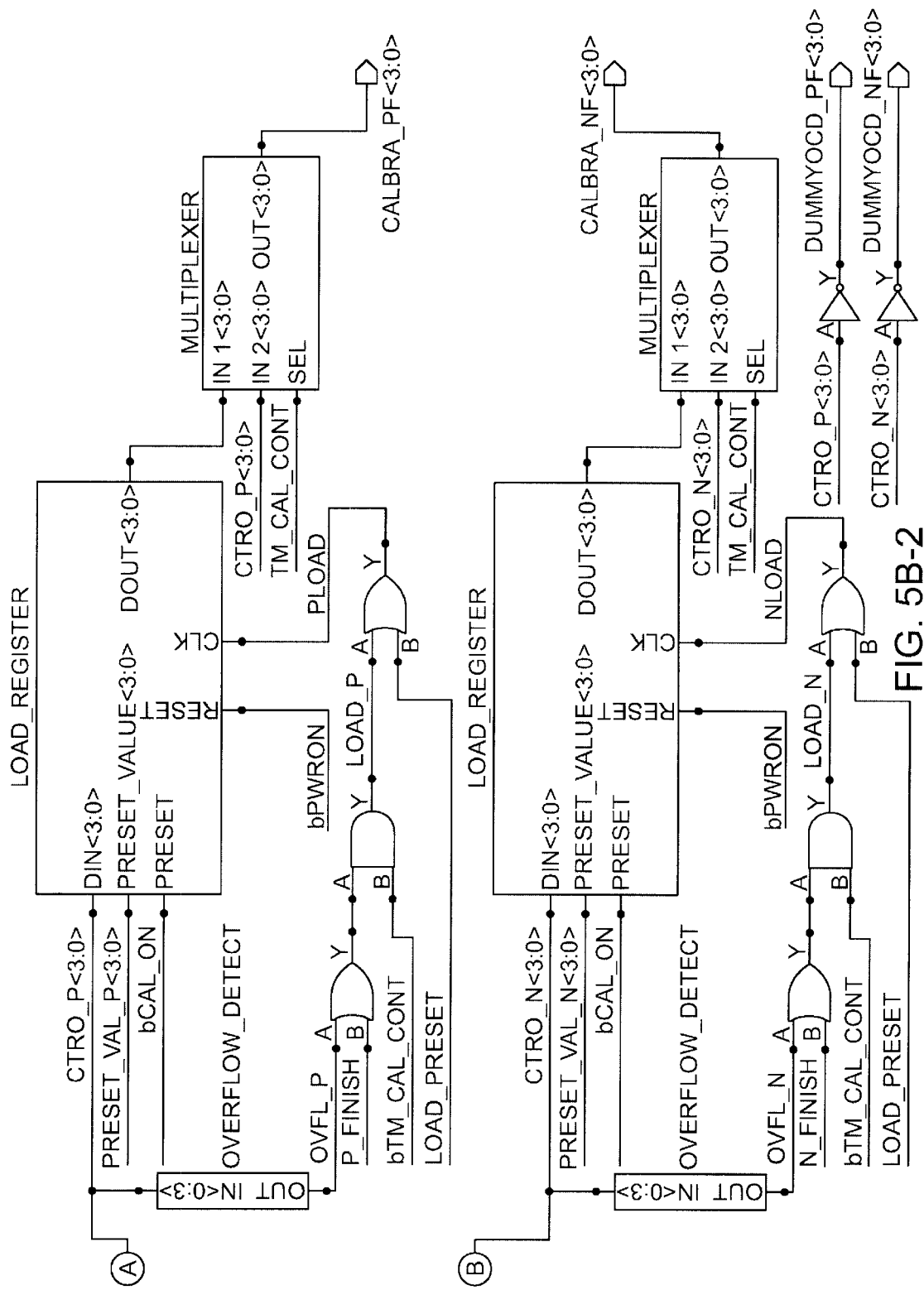

In the following, the operation of the impedance control circuit 22 will be described in detail with reference to FIGS. 4 and 5. When the integrated circuit is operating, the impedance control circuit 22 dynamically calibrates the output impedances of the push-up and pull-down circuits 10, 12 sequentially. This is achieved by determining the (dummy) impedance adjusting data necessary for proper impedance matching within the dummy circuit 32. Subsequently, the (determined) impedance adjusting data 30-n; 30-p (the so called current control bit) are outputted to the (actual) driver circuit. The calibration routine takes place periodically and hence the impedance adjusting data of the (actual) output driver will updated at regular intervals.

A calibration routine of the impedance control circuit 22 and the dummy circuit 32 might, for example, have the following steps:

Step 1: The PWRON signal is used to detect whether the chip is getting full power or not. When PWRON signal is LOW, the impedance control circuit 22 will not operate. When the PWRON signal is HIGH, then only the impedance control circuit 22 can be operated and CAL_ON signal is also HIGH.

Step 2: When both PWRON and CAL_ON signals are high, the calibration control operation can be started by applying a short pulse at the CAL_PULSE input. The calibration sequence includes the following:

first it will calibrate the n-MOS transistor part (the pull-down circuit), then the p-MOS transistor part (the push-up circuit). Thus, a short pulse at the CAL_PULSE input will trigger the START_N signal to be HIGH, which in turn will pass the clock signal to the N-bit counter for the n-MOS transistors. The counter will start counting from 0.1 . . . and so on. The counter outputs are the (dummy) impedance adjusting data for the dummy driver circuit. So, once the counter starts counting, the (dummy) impedance adjusting data for the n-transistors of the dummy driver circuit 34 will change and hence the resistance of the pull-down circuit 38 will change accordingly. Hence, VMEASN potential will be changed. The potential VMEASN is compared with the reference potential VREF in the comparator of the impedance control circuit 32.

When VMEASN just exceeds VREF, the comparator output N_FINISH will be HIGH, indicating that the resistance of the pull-down circuit 38 is equal to the characteristic impedance of the transmission line $Z_0$. This N_FINISH signal will reset the START_N signal and hence the clock signal to the counter will be stopped. Thus, the counter will stop counting and the last counter outputs will be loaded to the load registers for n-transistors by the LOAD_N signal. The load registers will output the correct impedance adjusting data to the pull-down circuit 12 of the (actual) driver circuit.

Step 3: Also, when the n-transistor calibration is finished, then the p-transistor calibration will be started by the LOAD_N signal to make the START_P signal HIGH. Hence, the N-bit counter for the p-transistors will get the clock and start counting from 0.1 . . . , and so on (in FIG. 4, N=4). The counter outputs will change the resistance of the p-transistors (the pull-up circuit 36) in the dummy driver circuit 34 in the same way as previously described with reference to the pull-down circuit 38. Thus, when VMEASP crosses VREF, the comparator output P_FINISH will be HIGH, which in turn will stop the counter by stopping the clock and the last counter outputs will be loaded in the load register for the p-transistors and will be outputted as the correct impedance adjusting data 30-p for the push-up circuit 10 of the driver circuit.

Overflow detectors are used to detect overflow conditions in both the counters and once an overflow is detected, it will stop the counter so as to prevent it from running in a continuous never ending loop. In the overflow case, the respective load registers and, hence, impedance adjusting data will be loaded with all logic "1" signals.

Step 4: When power is switched on, the impedance adjusting data of the actual output driver needs proper starting values for operation. When the PWRON signal is HIGH after power is switched on, the load registers for the p-transistors and n-transistors are loaded with PRESET-VAL_P<3:0> and PRESET-VAL_N<3:0> respectively. Then, with every calibration cycle, the impedance adjusting data are updated and loaded with correct values in accordance with the previously described calibration principle.

The test mode signals (all signals starting with TM_) allow to check the functionality of the impedance control circuit 22 as well as to manually control the impedance adjusting data of the (actual) driver circuit from the external world.

Once the TM_CAL_CONT is HIGH, the impedance control circuit 22 enters into the test mode operation. The outputs of the 4 BIT_COUNTERS are directly connected to the impedance adjusting data of the (actual) driver circuit. The 4 BIT_COUNTER for the p-transistors is then driven by TM_CLK_P and the 4 BIT_COUNTER for the n-transistors is then driven by TM_CLK_N, respectively. By applying clock pulses to TM_CLK_P and TM_CLK_N, the respective counters can be incremented and, hence, the respective impedance adjusting data of the (actual) driver circuit can be changed.

The TM_CAL_RESET signal is used to reset the necessary flip-flops asynchronously irrespective of whether TM_CAL_COUNT is HIGH or LOW.

For higher precision, counters with higher number of bits (>4 bits) can be used which will make the resistance of the p-transistors and n-transistors in the PP-OCD to be very close to the characteristic impedance $Z_0$ of the transmission line 18.

What is claimed is:

1. An output driver for an integrated circuit comprising:
   a driver circuit for driving an external circuit, the driver circuit having:
      a data input connected to the integrated circuit;
      a data output connected to a transmission line leading to the external circuit; and
      an impedance adjusting means for adjusting the output impedance of the driver circuit according to impedance adjusting data;
   a dummy circuit comprising a dummy driver circuit and a dummy transmission line, the dummy driver circuit and the dummy transmission line being electrical replicas of the driver circuit and the transmission line, respectively; and
   an impedance control circuit for controlling the output impedance of the driver circuit, the impedance control circuit being connected to the dummy circuit and the impedance adjusting means,
   wherein the impedance control circuit is configured to control the impedance of the driver circuit by determining the impedance adjusting data necessary for matching the output impedance of the dummy driver circuit to the impedance of the dummy transmission line and outputting the determined impedance adjusting data to the impedance adjusting means of the driver circuit, wherein the dummy driver circuit is a scaled down replica of the driver circuit.

2. The output driver according to claim 1, wherein the dummy transmission line includes at least one resistor selected from a group consisting of a polysilicon resistor, a diffusion resistor and a metal resistor.

3. The output driver according to claim 1, wherein the impedance adjusting means comprises impedance adjusting transistors connected in parallel, and the impedance adjusting data determine gate potentials of the impedance adjusting transistors.

4. The output driver according to claim 1, wherein the driver circuit is a push-pull on-chip current driver.

5. The output driver according to claim 4, wherein the impedance adjusting means comprise:
   a first transistor group having p-transistors connected in parallel between a high supply voltage and a push-up circuit of the driver circuit, and
   a second transistor group having n-transistors connected in parallel between a low supply voltage and a pull-down circuit of the driver circuit.

6. The output driver according to claim 5, wherein the first transistor group and the second transistor group each comprise N transistors and the impedance adjusting data comprise N-bit binary data.

7. The output driver according to claim 5, wherein the impedance control circuit is configured to determine and to output the impedance adjusting data at regular intervals.

8. The output driver according to claim 5, wherein the impedance control circuit comprises an adjusting data generator to output binary impedance adjusting data to the dummy driver circuit, and a comparator to compare the impedance of the dummy driver circuit to the characteristic impedance of the dummy transmission line.

9. A method for controlling the output impedance of an integrated circuit, the method comprising:
   providing a driver circuit for driving an external circuit, the driver circuit having:
      a data input connectable to the integrated circuit;
      a data output connectable to a transmission line leading to the external circuit; and
      an impedance adjusting means for adjusting the output impedance of the driver circuit according to determinable impedance adjusting data;
   determining the impedance adjusting data necessary for matching the output impedance of a dummy driver circuit to the characteristic impedance of a dummy transmission line, the dummy driver circuit and the dummy transmission line being electrical replica of the driver circuit and of the transmission line, respectively, wherein the dummy driver circuit is a scaled down replica of the driver circuit; and outputting the determined impedance adjusting data to the impedance adjusting means of the driver circuit to match the output impedance of the driver circuit to the characteristic impedance of the transmission line.

10. The method of claim 9, further comprising using at least one resistor selected from a group consisting of a polysilicon resistor, a diffusion resistor and a metal resistor.

11. The method of claim 9, further comprising using impedance adjusting transistors connected in parallel for the impedance adjusting means, wherein the impedance adjusting data determine gate potentials of the impedance adjusting transistors.

12. The method of claim 9, further comprising using a push-pull on-chip current driver as the driver circuit.

13. The method of claim 12, further comprising using, as the impedance adjusting means:

a first transistor group having p-transistors connected in parallel between a high supply voltage and a push-up circuit of the driver circuit, and a second transistor group having n-transistors connected in parallel between a low supply voltage and a pull-down circuit of the driver circuit.

14. The method of claim 13, further comprising:
using N-bit binary data for the impedance adjusting data;
using N transistors for the first transistor group; and
using N transistors for the second transistor group.

15. The method of claim 13, further comprising configuring the impedance control circuit to determine and to output the impedance adjusting data at regular intervals.

16. The method of claim 13, further comprising:
using an adjusting data generator, for the impedance control circuit, to output binary impedance adjusting data to the dummy driver circuit; and
comparing the impedance of the dummy driver circuit to the characteristic impedance of the dummy transmission line.

* * * * *